United States Patent [19]
Chang

[11] Patent Number: 6,145,647
[45] Date of Patent: Nov. 14, 2000

[54] AUTOMATIC CORRECTOR FOR ELECTRONIC PARTS QUEUING MACHINES

[76] Inventor: Chin-Sen Chang, P.O. Box 82-144, Taipei, Taiwan

[21] Appl. No.: 09/139,402

[22] Filed: Aug. 25, 1998

[51] Int. Cl.⁷ .................................................. B65G 47/24
[52] U.S. Cl. ........................................... 198/395; 198/401
[58] Field of Search ............................. 198/395, 397.06, 198/399, 401, 409

[56] References Cited

U.S. PATENT DOCUMENTS

| | | | |
|---|---|---|---|
| 3,005,539 | 10/1961 | Wellington | 198/395 |
| 3,236,374 | 2/1966 | Zimmerman et al. | 198/395 |
| 4,343,585 | 8/1982 | Tedeshi | 198/399 |
| 4,520,931 | 6/1985 | Evain | 198/399 |

*Primary Examiner*—Christopher P. Ellis
*Assistant Examiner*—Khot H. Tran
*Attorney, Agent, or Firm*—A & J

[57] ABSTRACT

An automatic corrector for electronic parts queuing machines includes an automatic correction apparatus disposed below conveyance rails, and an electronic eye device disposed in front of the automatic correction apparatus. The automatic correction apparatus includes an elevating device, a linkage device, a drive device, and a correction device. The drive device is used to drive the linkage device, which in turn brings the elevating device to perform elevating and lowering motions. The correction device includes at least one to three correction grooves that are provided on the elevating device. The correction grooves can be oblong V-shaped, oblong M-shaped, or triangular V-shaped. When any of the electronic parts on the conveyance rails tilts forwardly or rearwardly, it can be detected by the electronic eye device. The electronic eye device hence causes the conveyance rails to stop and further cause the automatic correction apparatus to elevate to guide the tilted electronic part(s) into the correction grooves. After the automatic correction apparatus has lowered, the electronic parts are returned to the conveyance rails, which continue to advance. The automatic corrector eliminates manual correction when trouble occurs so as to increase production capacity and reduce production costs.

11 Claims, 8 Drawing Sheets

AUTOMATIC CORRECTOR FOR ELECTRONIC PARTS QUEUING MACHINES

BACKGROUND OF THE INVENTION

1. Field of the Invention

The present invention relates to an automatic corrector for electronic parts queuing machines, more particularly to an automatic corrector having conveyance rails and being adapted for use in electronic parts queuing and packaging machines to eliminate manual correction.

2. Description of the Prior Art

In a conventional electronic parts queuing and packaging machine, after feeding, a pair of conveyance rails is used to transport the electronic parts in parallel arrays. However, if the electronic parts do not drop correctly into the triangular grooves of the conveyance rails during feeding, they may incline forwardly or tilt rearwardly. When an electronic eye device of the machine detects the same, it will cause the conveyance rails to stop advancing. At this point, the operator has to put the tilted electronic parts into their correct positions and then restarts the machine. But the rate of electronic parts not falling correctly into the triangular grooves of the conveyance rails is high, and operators have to be very attentive in monitoring the lines; otherwise, production capacity will be affected. This is a burden to operators, who may hence have no mood in working. Besides, the product costs will increase while efficiency drops.

The solution to this problem in the art is to provide an automatic corrector to corrector the position of the titled electronic parts when the machine stops and to put them back into their proper positions on the conveyance rails so that the conveyance rails can continue to advance.

SUMMARY OF THE INVENTION

The present invention relates to an automatic corrector for electronic parts queuing machines, more particularly to an automatic corrector having conveyance rails and being adapted for use in electronic parts queuing and packaging machines to eliminate manual correction.

A primary object of the present invention is to provide an automatic correction apparatus below the conveyance rails, with an electronic eye device disposed in front of the automatic correction apparatus.

The automatic correction apparatus is comprised of an elevating device, a linkage device, a drive device, and a correction device. The drive device is used to drive the linkage device, which in turn the said elevating device to perform elevating and lowering motions. The correction device follows the elevating device to move up and down. At least one to three correction grooves are provided on the elevating device. The correction grooves can be oblong V-shaped, oblong M-shaped, or triangular V-shaped. Furthermore, the conveyance rails are restarted by employing a proximity switch or a computer-controlled servomotor.

Advantages of the present invention are:

(1) Manual operation is not required. Correction operation is completely automatic.

(2) Production capacity and efficiency is increased, thus enhancing competitiveness.

(3) The construction is simple and is not vulnerable to trouble or damage.

(4) Labor costs are reduced. The mood of operators is not affected.

(5) Trouble shooting is quick.

DETAILED DESCRIPTION OF THE PREFERRED EMBODIMENT

Figure 1:
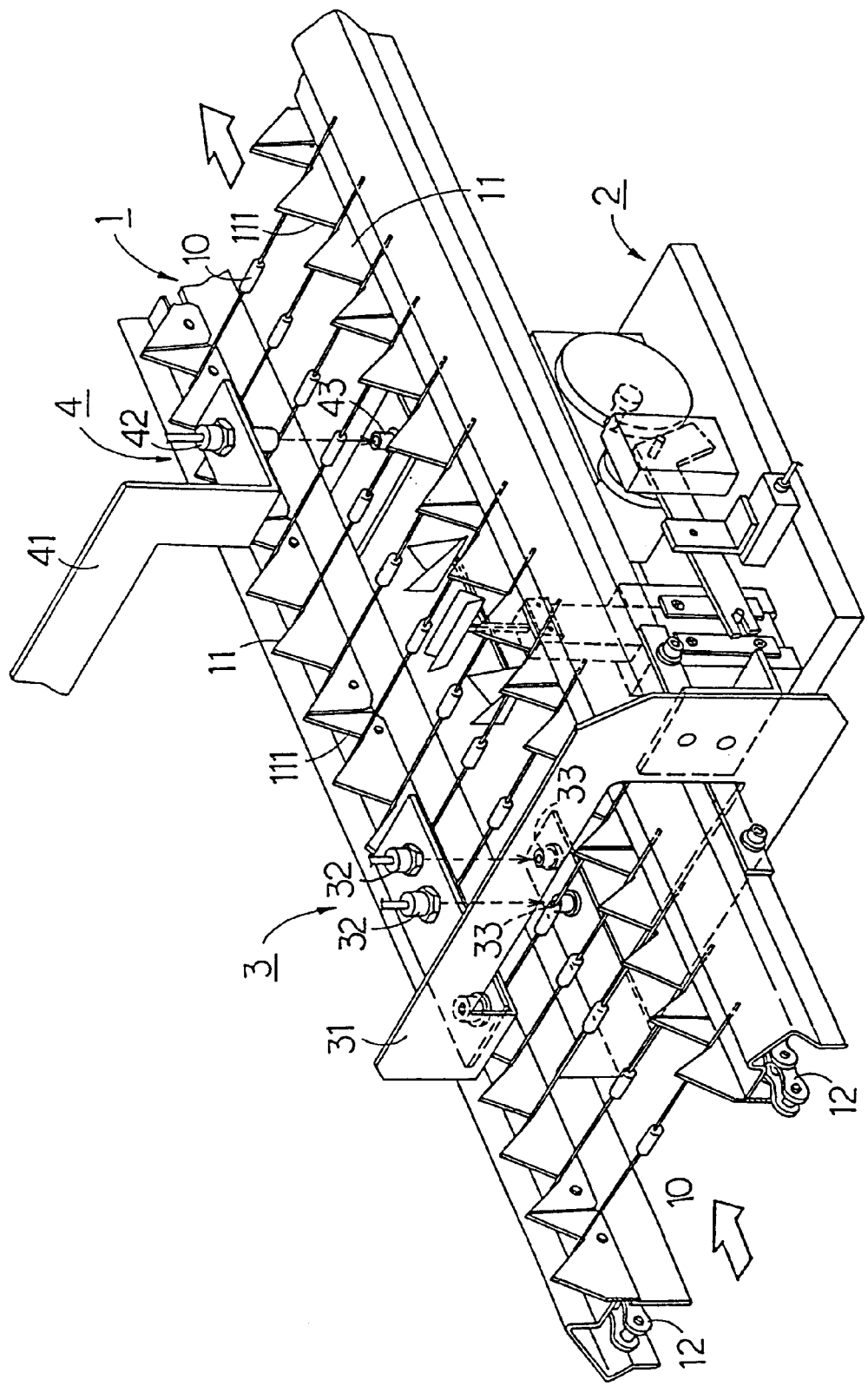
FIG. 1 is a perspective structural view of the automatic correction apparatus and conveyance apparatus according to the present invention.

FIG. 1 is a perspective view of a conveyance apparatus 1 and an automatic correction apparatus 2 according to the present invention. As shown, the conveyance apparatus 1 includes double rails 11 being advanced by chains 12. Double rails 11 has a plurality of triangular grooves 111 for placement of electronic parts 10, so that they can be neatly and orderly arranged in a parallel manner. The automatic correction apparatus 2 is provided below the double rails 11. A first electronic eye device 3 is disposed in front of the automatic correction device 2, whereas a second electronic eye device 4 provided behind the automatic correction apparatus 2. The first electronic eye device 3 is used to detect whether or the electronic parts incline forwardly or tilt rearwardly, and to stop the machine and actuate the automatic correction apparatus 2 if necessary. The second electronic eye device 4 is used to detect whether there are any electronic parts missing, and to stop the machine and to supplement the missing parts before the machine starts again if necessary. The first electronic eye device 3 includes a support frame 31, two emitting ports 32 provided on an upper end of the support frame 31, and two receiving ports 33 disposed at a lower end of the support frame 3 in correction and cooperation with the emitting ports 32. The second electronic eye device 4, on the other hand, includes a bracket 41, an emitting port 42 on the bracket 4, and a receiving port 43 at a lower end of the bracket 41.

Figure 2:
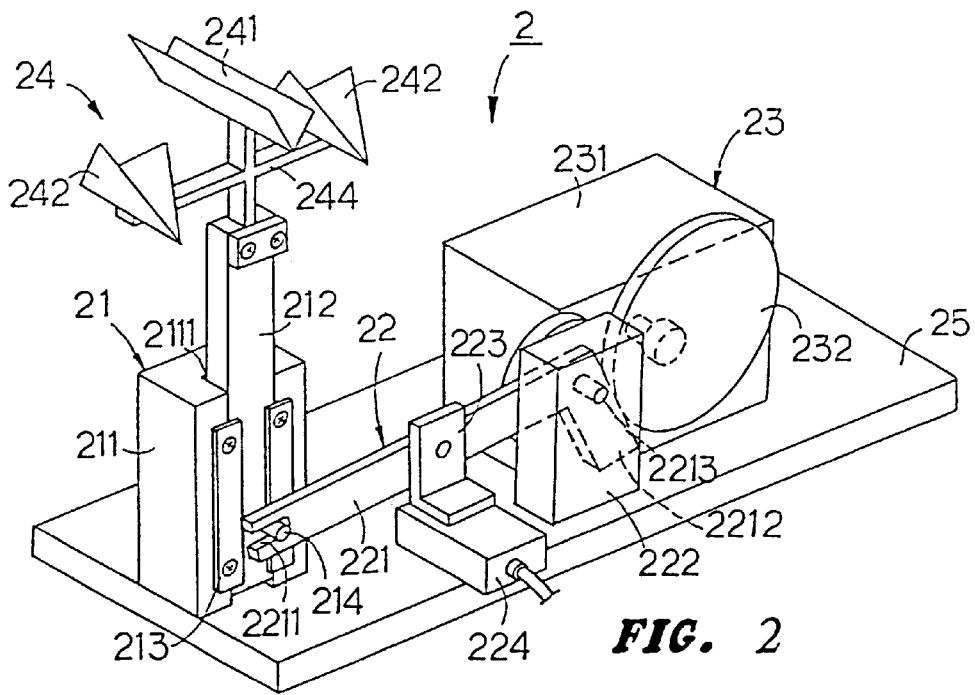
FIG. 2 is a perspective structural view of the first embodiment of the automatic correction apparatus according to the present invention.
Figure 3:
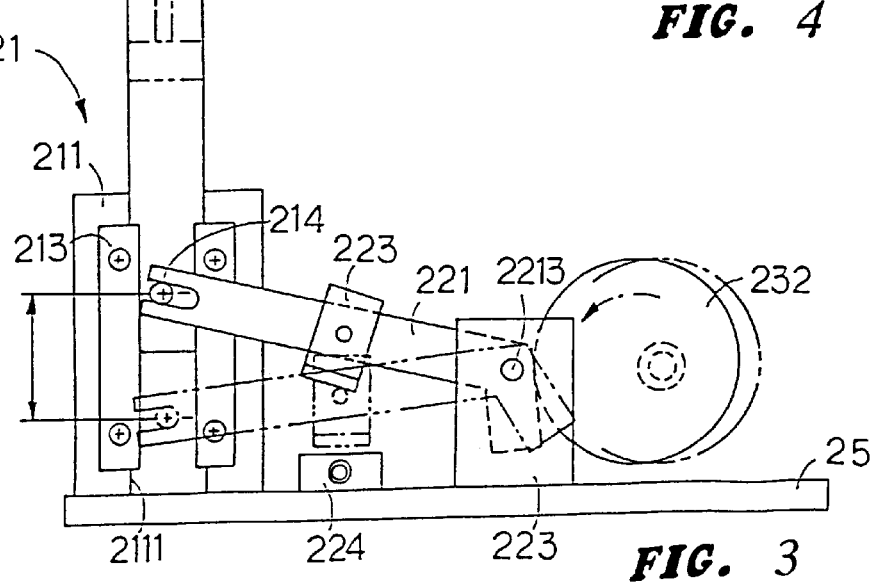
FIG. 3 illustrates the action of the first embodiment shown in FIG. 2.
Figure 14:
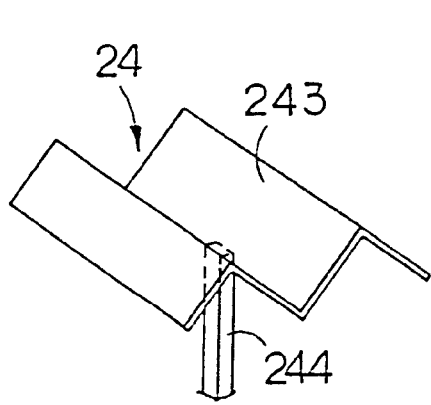
FIG. 14 is a perspective view of another embodiment of the correction apparatus of the present invention.

There are several embodiments of the automatic correction apparatus 2. In the first embodiment as shown in FIGS. 2 and 3, it is comprised of an elevating device 21, a linkage device 22, a drive device 23, and a correction device 24. The drive device 23 is used to drive the linkage device 22, which in turn brings the elevating device 21 to elevate or drop. The elevating device 21 has the correction device 24 provided thereon. The latter includes a support frame 244 and correction grooves, in which there are three types of correction groove, oblong V-shaped grooves 241, triangular V-shaped grooves 242, and oblong M-shaped grooves 243 (as shown in FIG. 14 and to be described hereinafter).

Figure 4:
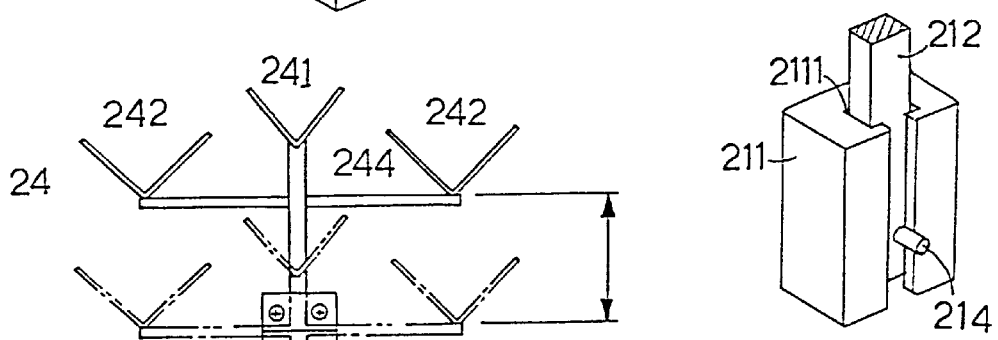
FIG. 4 illustrates the cooperation between the upright block and the upright rod of the first embodiment in FIG. 2.

The above-mentioned elevating device 21 includes an upright block 211 having a vertical rail groove 2111 provided therein, an vertically oriented upright rod 212 provided in the rail groove 2111, and stops 213 on both sides of the rail groove 2111 to press against the upright rod 212. (In the embodiment shown in FIG. 4, the rail groove 2111 is a T-shaped groove.) An upper end of the upright rod 212 has a correction device 24 secured thereon. The correction device 24 includes a support frame 244 and one to three correction grooves, in which the one in the middle is an oblong V-shaped groove 241, and the ones on both sides are triangular V-shaped grooves 242, the grooves 242 on both sides being at a lower position than the groove 241 in the middle.

The above-mentioned linkage device 22 is comprised of a substantially L-shaped link 221 and a support block 222. The link 221 is pivotally mounted on the support block 222 by means of an axial bolt 2213, and has a front end provided with a notch 2211 for engaging a protruding bolt 214 at a lower end of the above-mentioned upright rod 212, and a rear end having a support rod 2212 that has a small slanting angle. In addition, an L-shaped angular block 223 is provided on the link 221 at a suitable position. A base plate 25 below the angular block 223 has a proximity switch 224 fixedly provided thereon. When the link 221 swings using the axial bolt 2213 as center, the upright rod 212 will perform a linear elevating motion.

The above-mentioned drive device 23 includes a servomotor 231 and an eccentric wheel 232. The rim of the eccentric wheel 232 is in a tangential contact with the support rod 2212 at the rear end of the link 221. When the eccentric wheel 232 rotates, its eccentric rotation causes the support rod 2212 having a slanting angle to swing using the axial bolt 2213 as center, further causing the link 221 to perform a swinging motion through a larger angle.

The above-mentioned first electronic eye device 3 can stop the conveyance apparatus 1. But restarting the apparatus requires the lowering of the link 221, using the angular block 223 and the proximity 224 to produce a reaction to cause the conveyance apparatus 1 to start. Another method of restarting the conveyance apparatus 1 is that a microcomputer is used to control the rotational distance (i.e., after the eccentric wheel has made one revolution) of the servomotor 231 to start the conveyance apparatus 1. The control of the stop and restarting of the conveyance apparatus 1 plus the correction apparatus 2 together achieve the object of automatic correction.

Figure 5:
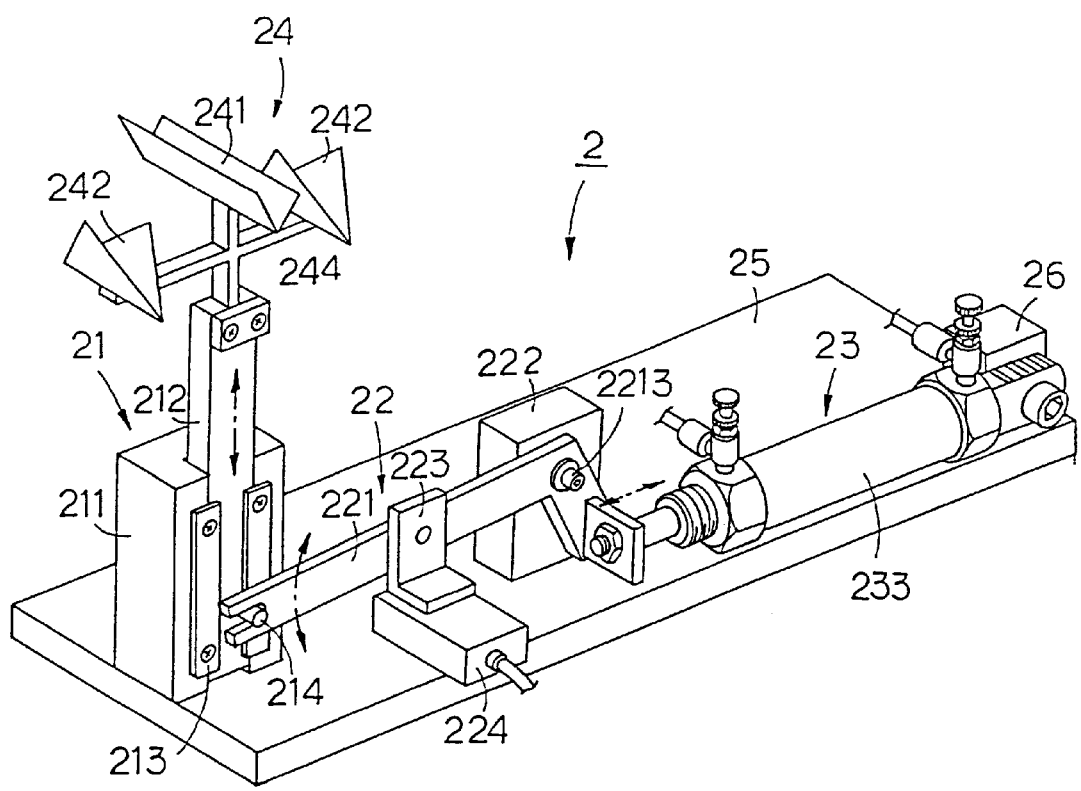
FIG. 5 is a perspective structural view of the second embodiment of the automatic correction apparatus according to the present invention.

FIG. 5 shows the second embodiment of the automatic correction apparatus of the present invention. Compared to the first embodiment, the second embodiment is different only in the drive device 23. In this embodiment, the drive device 23 employs a pneumatic cylinder 233. A rear end of the pneumatic cylinder 233 is secured on a stop block 26, with a rear end secured at a rear end of the link 221. When the pneumatic cylinder 233 travels to allow entry and discharge of gas, the link 221 is caused to perform a swinging motion.

Figure 6:
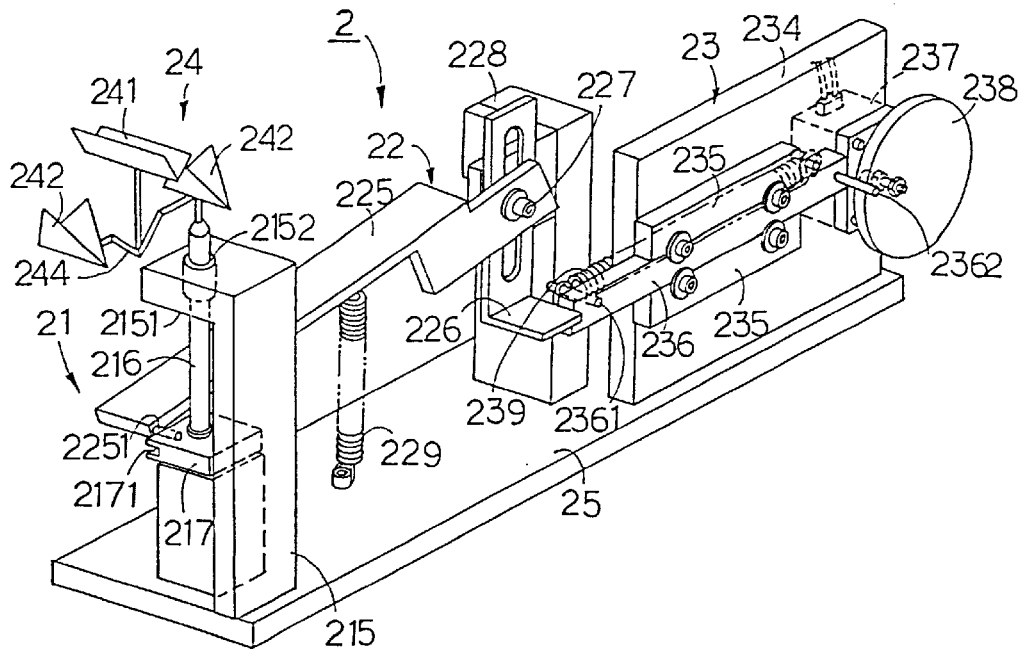
FIG. 6 is a perspective structural view of the third embodiment of the automatic correction apparatus according to the present invention.
Figure 7:
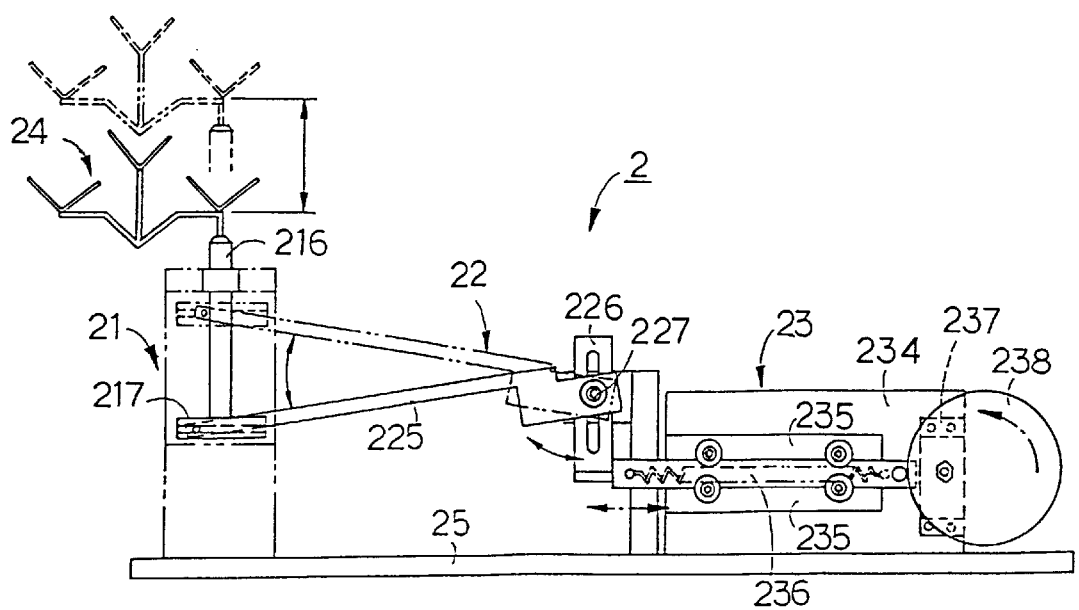
FIG. 7 illustrates the action of the automatic correction apparatus of the third embodiment of the present invention.

FIGS. 6 and 7 show the third embodiment of the automatic correction apparatus of the present invention. This embodiment is comprised of the elevating device 21, linkage device 22, and drive device 23. The elevating device includes an upright block 215 having a groove 2151, a shaft 216 vertically provided on the upright block 215, and a bottom block 217 secured at a bottom end of the shaft 216. An upper end of the shaft 216 is inserted into bearing 2152. The bottom block 217 has a side notch 2171.

The above-mentioned linkage device 22 includes a link 225 and a swing link 226 commonly secured on a support block 228 using an axial bolt 227 (the link 225 can also be formed integrally with the swing link 226 and pivotally provided on the support block 228). A front end of the link 225 has a pin 2251, which can extend into the notch 2171 of the bottom block 217. When the link 225 swings, it can bring the bottom block 217 and the shaft 216 to perform a linear up-and-down movement. Furthermore, in order that the link 225 can reset quickly, a spring 229 can be additionally provided at a suitable position with the other end secured on the bottom plate 25.

The above-mentioned drive device 23 includes an upright base block 234, two parallel level guide blocks 235 fixedly provided on the base block 234, a push rod 236 located between the guide blocks 235, a motor 237 and an eccentric wheel 238 provided at a rear end of the base block 234, and a suspended type spring 237 provided on a rear side of the base block 234. A front end of the push rod 236 is in contact with the swing link 226 and has a laterally oriented post 2361 for engaging one end of the spring 239, the other end of the spring 239 being suspendedly provided on the rear side of the base block 234. A rear end of the push rod 236 likewise has a laterally oriented projection 2362, which is in contact with the eccentric wheel 238. When the eccentric wheel 238 rotates, the push rod 236 will be brought to displace forwardly and rearwardly. In addition, the shaft 216 of the elevating device 21 has a correction device 24 fixedly provided at an upper end thereof. The correction device in this embodiment is different from the previous ones in that the shaft 216 is connected to a lateral end of the support frame 244 instead of the middle thereof.

Figure 8:
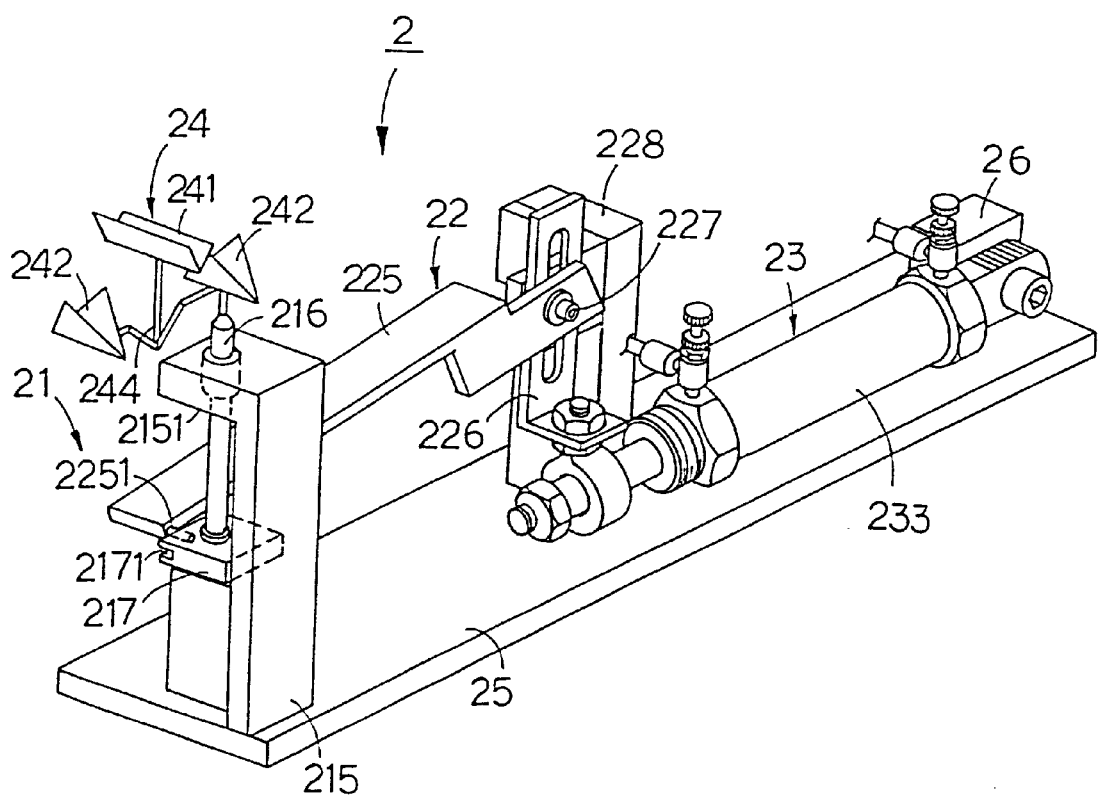
FIG. 8 is a perspective structural view of the fourth embodiment of the automatic correction apparatus of the present invention.

FIG. 8 shows the fourth embodiment of the automatic correction apparatus according to the present invention. Compared to the third embodiment, this embodiment is different in that drive device 23 adopted. In this embodiment, the pneumatic cylinder 233 is used as the drive device 23. The rear end of the pneumatic cylinder 233 is secured on a stop block 26, while the front end is secured at a lower end of the swing link 226. When the pneumatic cylinder 233 travels to allow entry and discharge of gas, the link 225 can be caused to perform a swinging motion.

Figure 9:
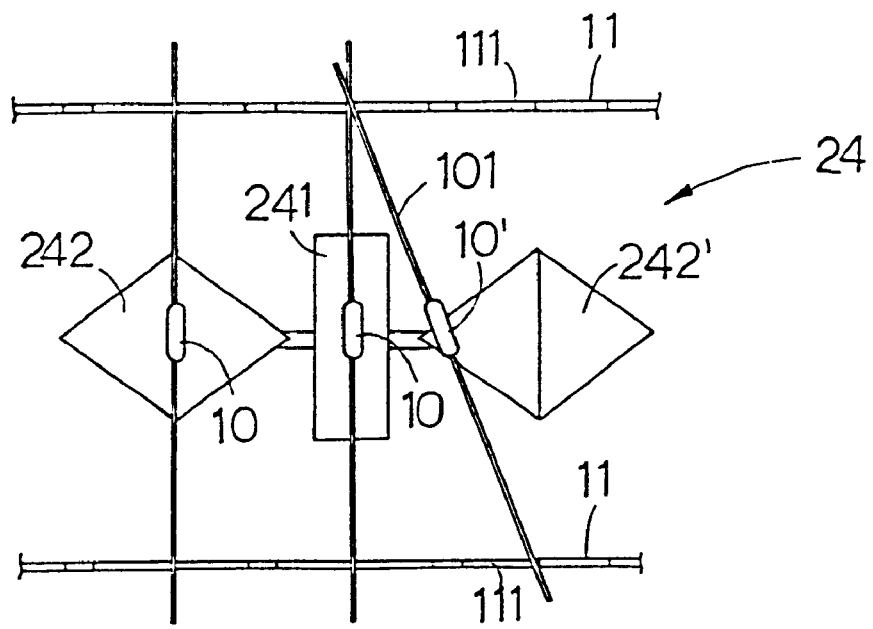
FIG. 9 is a top view illustrating the electronic parts on the conveyance apparatus in a rearwardly tilting state.
Figure 10:
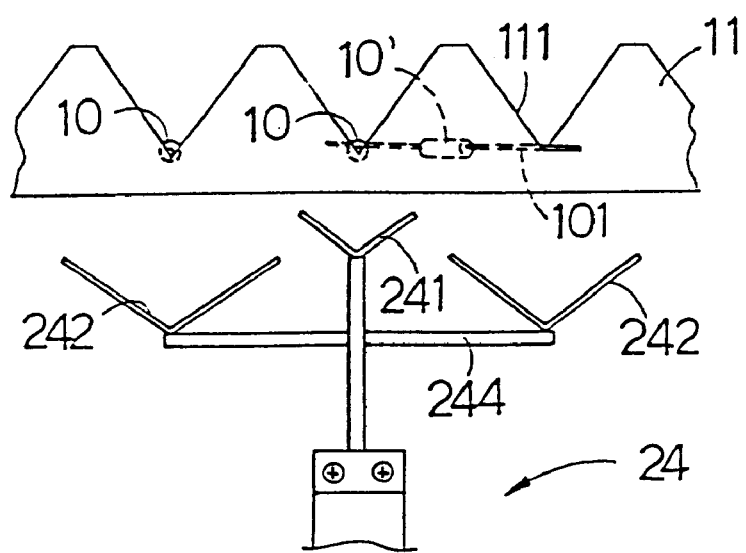
FIG. 10 is a side view of FIG. 9.
Figure 11:
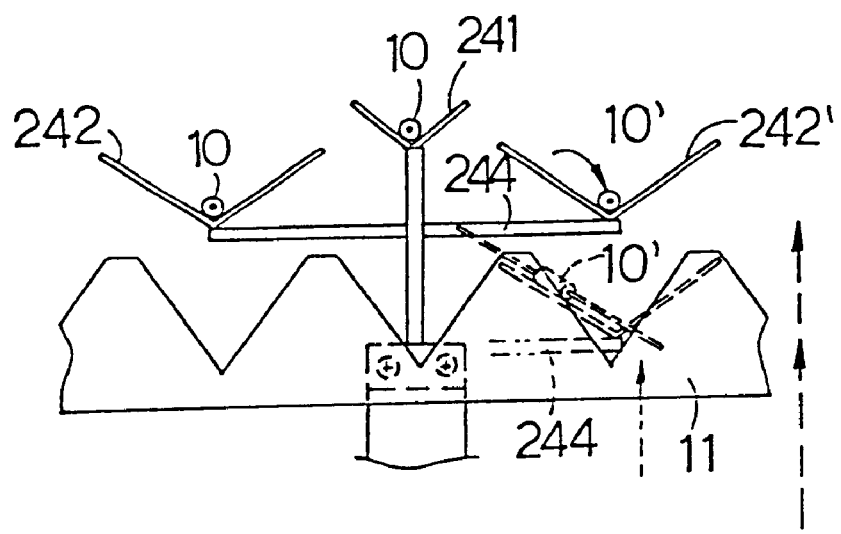
FIG. 11 illustrates the action of the embodiment shown in FIG. 9.
Figure 12:
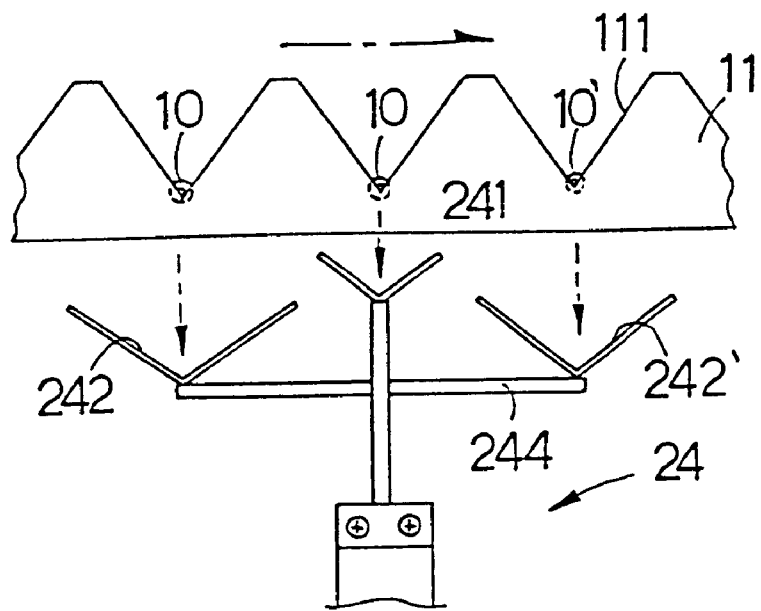
FIG. 12 further illustrates the action of the embodiment shown in FIG. 9.

FIGS. 9 and 10 are respectively top and side views showing the electronic parts on the conveyance apparatus tilting rearwardly. An electronic part 10' has a metal leg 101 tilting rearwardly, and the correction device 24 is located just below the parts. The middle correction groove 241 is located below the part in the middle, whereas the front and rear correction grooves 242', 242 are respectively located below the front and rear electronic parts. However, an upper end of the correction groove 242 can extend to below the tilted electronic part. When the tilted electronic part 10' passes by the first electronic eye device 3, the double rails 11 will stop movement and, after the correction device 24 has elevated (as shown in FIG. 11), two of the electronic parts 10 will fall correctly into the middle correction groove 241 and the rear correction groove 242, while the tilted electronic part 10 will be guided into the front correction groove 242' before rolling down to the bottom. Furthermore, when the correction device 24 lowers (as shown in FIG. 12), the electronic parts 10, 10' in the three correction grooves 241, 242, and 242' will fall into the triangular grooves ill of the double rails 11. At this point, the three electronic parts are located in proper positions. When the correction device 24 continues to lower until the link 221 has lowered to a certain height, the angular block 223 is near the proximity switch 224 (shown in FIG. 2), so that the double rails start operation and continue to advance. In addition, the servomotor 231 can be controlled by a microcomputer to cause the double rails 11 to move forward after the eccentric wheel has made on revolution.

Figure 13:
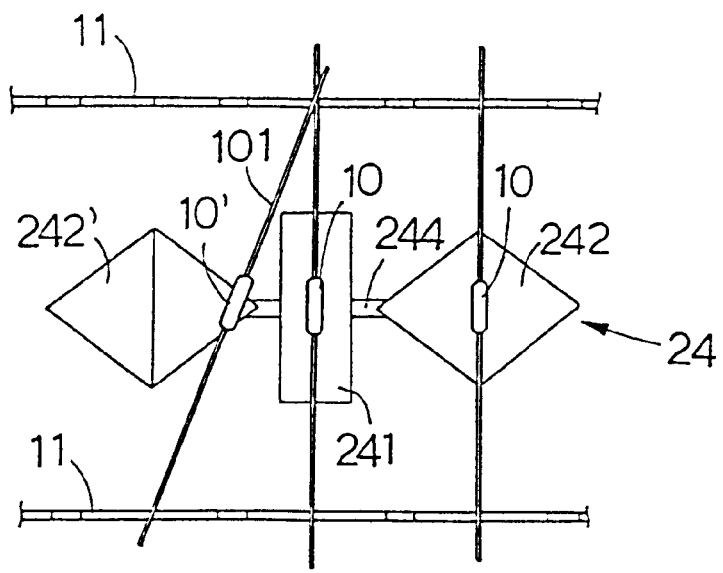
FIG. 13 is a top view illustrating the electronic parts on the conveyance apparatus in a forwardly inclining state.

FIG. 13 is a top view illustrating the electronic parts on the conveyance apparatus inclining forwardly. As shown, the electronic part 10' has a metal leg 101 inclining forwardly, and the correction device 24 is disposed just below the parts. The correction of the inclining electronic part 10' is the same as that described hereinabove and will not be discussed again.

Figure 15:
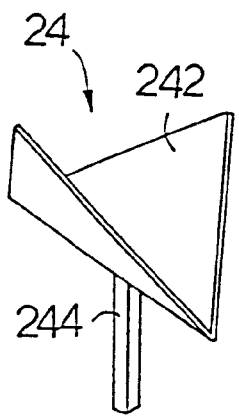
FIG. 15 is a perspective view of a further embodiment of the correction apparatus of the present invention.

FIGS. 14 and 15 are perspective views of the other two embodiments of the correction device of the present invention. Although the previous drawings show the correction device 24 to include an assembly of three correction grooves, a single correction groove can also be used, for instance, the oblong m-shaped correction groove 243 in FIG. 14, and the triangular V-shaped correction groove 242 in FIG. 15. Furthermore, an oblong V-shaped correction groove 141 and a triangular V-shaped correction groove 242 can cooperate to form the correction device 24.

I claim:

1. An automatic corrector for electronic parts queuing machines, comprising an automatic correction apparatus disposed below conveyance rails, and an electronic eye device disposed in front of said automatic correction apparatus, wherein:

said automatic correction apparatus includes an elevating device, a linkage device, a drive device, and a correction device, said drive device being used to drive said linkage device, which in turn brings said elevating device to perform elevating and lowering motions, said elevating device having said correction device provided thereon, said elevating device including an upright block accommodating therein a reciprocating upright rod, said upright rod having at least one substantially V-shaped correction groove at an upper end, and being coupled to an L-shaped link of said linkage device at a lower end, said L-shaped link being pivotally provided on a support block and having a rear end support rod in a tangential contact with an eccentric wheel of said drive device, said eccentric wheel being driven by a servo motor, said L-shaped link further having an L-shaped angular block provided in a suitable position, a proximity switch being disposed below said angular block; when any of the electronic parts on said conveyance rails tilts forwardly or rearwardly, such can be detected by said electronic eye device, which will cause said conveyance rails to stop and cause said automatic correction apparatus to elevate to guide the tilted electronic part(s) into said correction groove, and to cause the tilted electronic part(s) to return to said conveyance rails after said automatic correction apparatus has lowered, further utilizing a short-distance contact between said L-shaped angular block and said proximity switch to start said conveyance rails and to make them continue to advance.

2. The automatic corrector for electronic parts queuing machines as claimed in claim 1, wherein said drive device is a pneumatic cylinder that has a rear end secured on a stop block and a front end coupled to said rear end support rod of said L-shaped link.

3. The automatic corrector for electronic parts queuing machines as claimed in claim 1, wherein said correction device includes one to three correction grooves.

4. The automatic corrector for electronic parts queuing machines as claimed in claim 1, wherein said correction groove is oblong V-shaped.

5. The automatic corrector for electronic parts queuing machines as claimed in claim 1, wherein said correction groove is oblong M-shaped.

6. The automatic corrector for electronic parts queuing machines as claimed in claim 1, wherein said correction groove is triangular V-shaped.

7. An automatic corrector for electronic parts queuing machines comprising an automatic correction apparatus disposed below conveyance rails, and an electronic eye device disposed in front of said automatic correction apparatus, wherein:

said automatic correction apparatus includes an elevating device, a linkage device, a drive device, and a correction device, said drive device being used to drive said linkage device, which in turn brings said elevating device to perform elevating and lowering motions, said elevating device having said correction device provided thereon, said elevating device including an upright block internally provided with a vertical shaft, said shaft having a bottom block at a bottom end and connected to a V-shaped correction groove at an upper end, said bottom block having a side notch for receiving a pin at a front end of a link of said linkage device, a rear end of said link being connected to a swing link and pivotally provided on a support block, said swing link being capable of contacting a front end of a push rod of said drive device, said push rod being provided intermediate two parallel guide blocks on an upright base block, a rear end of said push rod being in contact with an eccentric wheel in front of a small motor.

8. The automatic corrector for electronic parts queuing machines as claimed in claim 7, wherein said drive device is a pneumatic cylinder having a rear end secured on a stop block and a front end coupled to said swing link.

9. The automatic corrector for electronic parts queuing machines as claimed in claim 7, wherein said push rod has a spring suspendedly provided at a front end thereof, the other end of said spring being suspendedly disposed on a rear side of said base block.

10. The automatic corrector for electronic parts queuing machines as claimed in claim 7, wherein said link has a spring suspendedly provided in a suitable position, the other end of said spring being secured on a base plate.

11. The automatic corrector for electronic parts queuing machines as claimed in claim 7, wherein said correction device includes one to three correction grooves.

* * * * *